United States Patent
Arimoto et al.

(10) Patent No.: US 11,696,506 B2
(45) Date of Patent: Jul. 4, 2023

(54) PIEZOELECTRIC DEVICE WITH ORIENTATION CONTROL LAYER FORMED OF SAZO AND MANUFACTURING METHOD THEREOF

(71) Applicant: NITTO DENKO CORPORATION, Ibaraki (JP)

(72) Inventors: Masaharu Arimoto, Ibaraki (JP); Hironobu Machinaga, Ibaraki (JP); Masato Katsuda, Ibaraki (JP); Manami Kurose, Ibaraki (JP)

(73) Assignee: NITTO DENKO CORPORATION, Ibaraki (JP)

( * ) Notice: Subject to any disclaimer, the term of this patent is extended or adjusted under 35 U.S.C. 154(b) by 578 days.

(21) Appl. No.: 16/497,969

(22) PCT Filed: Mar. 8, 2018

(86) PCT No.: PCT/JP2018/009015
§ 371 (c)(1),
(2) Date: Sep. 26, 2019

(87) PCT Pub. No.: WO2018/180340
PCT Pub. Date: Oct. 4, 2018

(65) Prior Publication Data
US 2020/0381610 A1 Dec. 3, 2020

(30) Foreign Application Priority Data
Mar. 29, 2017 (JP) .................................. 2017-065547

(51) Int. Cl.
*H01L 41/08* (2006.01)
*H01L 41/047* (2006.01)
(Continued)

(52) U.S. Cl.
CPC ..... *H10N 30/10516* (2023.02); *H10N 30/076* (2023.02); *H10N 30/079* (2023.02);
(Continued)

(58) Field of Classification Search
CPC ... H01L 41/187; H01L 41/316; H01L 41/319; H01L 41/0478; H01L 41/0815; H01L 41/1132
(Continued)

(56) References Cited

U.S. PATENT DOCUMENTS

2003/0222947 A1   12/2003   Tomozawa et al.
2005/0194626 A1   9/2005    Noguchi et al.
(Continued)

FOREIGN PATENT DOCUMENTS

CN   1656623 A   8/2005
CN   1665043 A   9/2005
(Continued)

OTHER PUBLICATIONS

International Search Report for corresponding international application PCT/JP2018/009015 dated May 15, 2018 (4 pages).
(Continued)

*Primary Examiner* — Shawki S Ismail
*Assistant Examiner* — Monica Mata
(74) *Attorney, Agent, or Firm* — Hauptman Ham, LLP

(57) ABSTRACT

A piezoelectric device has a layered structure in which at least a first electrode, a plastic layer, an orientation control layer, a piezoelectric layer, and a second electrode are stacked, wherein the orientation control layer is amorphous, and the piezoelectric layer with a thickness of 20 nm to 250 nm is provided over the orientation control layer, the piezoelectric layer having a wurtzite crystal structure, and
(Continued)

wherein the orientation control layer and the piezoelectric layer are provided between the first electrode and the second electrode.

16 Claims, 8 Drawing Sheets

(51) Int. Cl.

| | |
|---|---|
| *H01L 41/113* | (2006.01) |
| *H01L 41/187* | (2006.01) |
| *H01L 41/316* | (2013.01) |
| *H01L 41/319* | (2013.01) |
| *H10N 30/00* | (2023.01) |
| *H10N 30/076* | (2023.01) |
| *H10N 30/079* | (2023.01) |
| *H10N 30/30* | (2023.01) |
| *H10N 30/853* | (2023.01) |
| *H10N 30/87* | (2023.01) |

(52) U.S. Cl.
CPC ......... *H10N 30/302* (2023.02); *H10N 30/853* (2023.02); *H10N 30/878* (2023.02)

(58) Field of Classification Search
USPC .......................................... 310/358
See application file for complete search history.

(56) References Cited

U.S. PATENT DOCUMENTS

| | | | |
|---|---|---|---|
| 2005/0218756 A1 | 10/2005 | Fujii et al. | |
| 2005/0236710 A1 | 10/2005 | Akiyama et al. | |
| 2005/0280335 A1 | 12/2005 | Tomozawa et al. | |
| 2006/0131680 A1 | 6/2006 | Akiyama et al. | |
| 2007/0015361 A1* | 1/2007 | Tateishi | B81C 1/00246 438/689 |
| 2007/0108866 A1 | 5/2007 | Conley, Jr. et al. | |
| 2010/0038991 A1* | 2/2010 | Shih | H03H 9/02574 310/313 B |
| 2012/0194283 A1 | 8/2012 | Funakawa et al. | |
| 2013/0105301 A1 | 5/2013 | Yamazaki et al. | |
| 2014/0339962 A1* | 11/2014 | Furukawa | H01L 41/1873 310/363 |
| 2015/0022592 A1* | 1/2015 | Aoyama | H01L 41/0973 29/25.35 |
| 2015/0165479 A1* | 6/2015 | Lasiter | H01L 41/31 29/25.35 |
| 2016/0126469 A1 | 5/2016 | Nakano | |
| 2017/0228072 A1 | 8/2017 | Amin et al. | |

FOREIGN PATENT DOCUMENTS

| | | |
|---|---|---|
| CN | 101322258 A | 12/2008 |
| JP | 2003-188428 A | 7/2003 |
| JP | 2003-347613 A | 12/2003 |
| JP | 2004-235599 A | 8/2004 |
| JP | 2004-282913 A | 10/2004 |
| JP | 2005-119166 A | 5/2005 |
| JP | 2005-252069 A | 9/2005 |
| JP | 2005-333108 A | 12/2005 |
| JP | 2006-86142 A | 3/2006 |
| JP | 2006-121228 A | 5/2006 |
| JP | 2008-211095 A | 9/2008 |
| JP | 2011-185681 A | 9/2011 |
| JP | 2012-160995 A | 8/2012 |
| JP | 2016-134447 A | 7/2016 |
| TW | 201621585 A | 6/2016 |
| WO | 2012/005290 A1 | 1/2012 |
| WO | 2015/053345 A1 | 4/2015 |

OTHER PUBLICATIONS

Extended European Search Report issued for corresponding European Patent Application No. 18777140.7 dated Nov. 27, 2020 (8 pages).
Akiyama et al., "Flexible piezoelectric pressure sensors using oriented aluminum nitride thin films prepared on polyethylene terephthalate films", Journal of Applied Physics, vol. 100, No. 11, 2006, 114318 (5 pages).
Akiyama et al., "Sensitivity enhancement in diaphragms made by aluminum nitride thin films prepared on polyimide films", Applied Physics Letters, vol. 92, No. 4, 2008, 43509 (3 pages).
Office Action issued for corresponding Taiwanese Patent Application No. 107110698 dated Jul. 8, 2021, along with an English translation (16 pages).
Office Action dated Nov. 2, 2021, for Japanese Patent Application No. 2018-041745, along with an English translation (7 pages).
Office Action dated Mar. 18, 2023 for corresponding Chinese Patent Application No. 201880020923.X, along with an English translation (19 pages).
Office Action dated Mar. 18, 2023 for corresponding Chinese Patent Application No. 201880020923.X, along with an English machine translation (19 pages).

\* cited by examiner

FIG.1
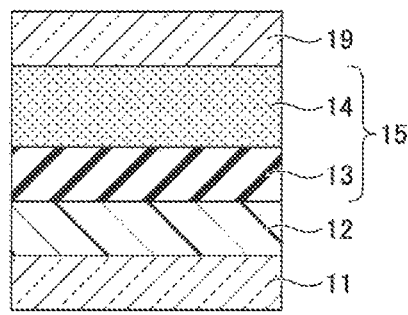
FIG. 2(A)
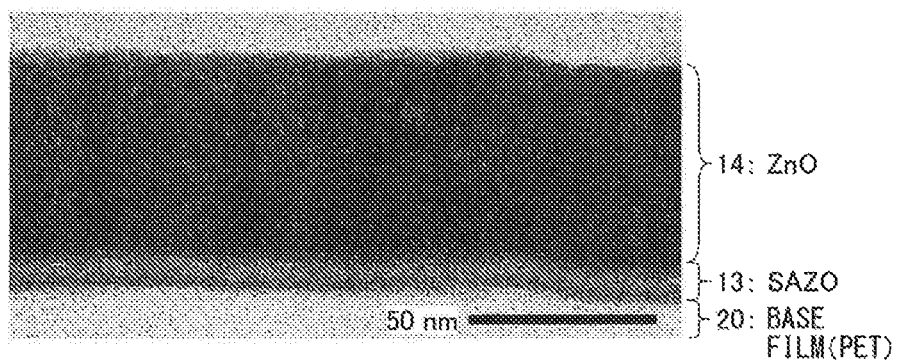
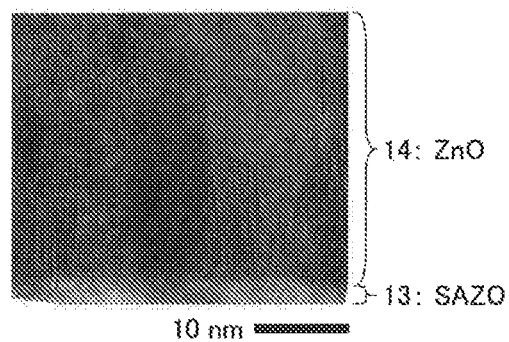
FIG. 2(B)

FIG. 3(A)  XRD
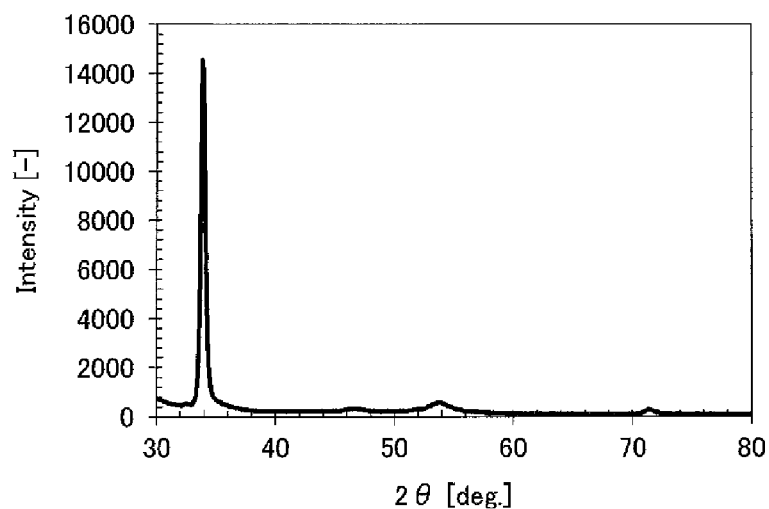
FIG. 3(B)  XRC
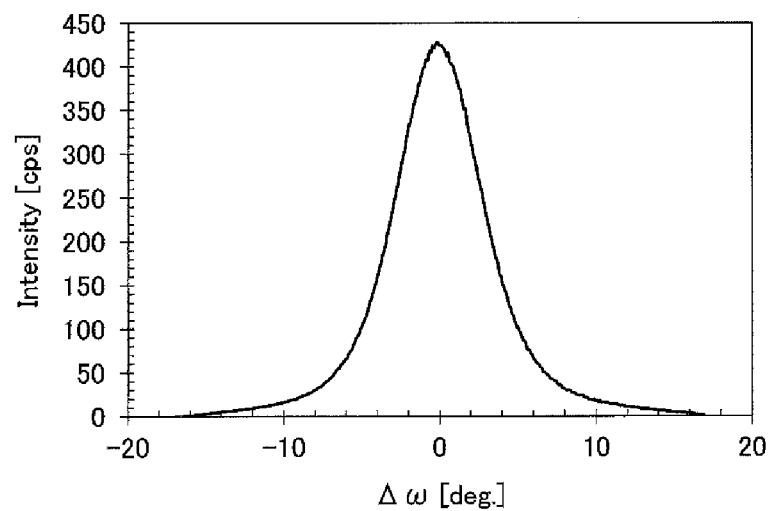

FIG.4A

| | piezoelectric layer | | | orientation control layer | | | base film | | piezoelectric properties | | degree of cracking (initial state) | | degree of cracking (after bending) | | overall evaluation |
|---|---|---|---|---|---|---|---|---|---|---|---|---|---|---|---|
| | material | sub-component | thickness | material | phase | thickness | material | thickness | C-axis orientation | response | visual inspection | haze | visual inspection | haze | |
| | - | - | [nm] | - | | [nm] | - | [μm] | [°] | [-] | - | [%] | - | [%] | |
| Ex. 1 | ZnO | - | 50 | SAZO | α | 10 | COP | 100 | 11 | ◎ | ○ | 1 | ○ | - | ◎ |
| Ex. 2 | ZnO | - | 30 | SAZO | α | 10 | COP | 100 | 14 | ◎ | ○ | - | ○ | - | ◎ |
| Ex. 3 | ZnO | - | 100 | SAZO | α | 10 | COP | 100 | 9 | ◎ | ○ | - | ○ | - | ◎ |
| Ex. 4 | ZnO | - | 200 | SAZO | α | 10 | COP | 100 | 7 | ◎ | ○ | - | ○ | - | ◎ |
| Ex. 5 | ZnO | - | 50 | SAZO | α | 50 | COP | 100 | 15 | ○ | ○ | - | ○ | - | ○ |
| Ex. 6 | ZnO | - | 50 | SAZO | α | 3 | COP | 100 | 15 | ○ | ○ | - | ○ | - | ○ |
| Ex. 7 | ZnO | - | 50 | SAZO | α | 10 | PI | 50 | 11 | ◎ | ○ | - | ○ | - | ◎ |
| Ex. 8 | ZnO | - | 50 | AlN | α | 50 | COP | 100 | 14 | ◎ | ○ | - | ○ | - | ◎ |
| Ex. 9 | ZnO | - | 50 | SiO₂ | α | 50 | COP | 100 | 15 | ○ | ○ | - | ○ | - | ○ |
| Ex. 10 | ZnO | - | 50 | SAZO | α | 10 | PET | 125 | 14 | ◎ | ○ | 2 | ○ | 2 | ◎ |

FIG.4B

| | piezoelectric layer | | | orientation control layer | | | base film | | piezoelectric properties | | degree of cracking (initial state) | | degree of cracking (after bending) | | overall evaluation |
|---|---|---|---|---|---|---|---|---|---|---|---|---|---|---|---|
| | material | sub-component | thickness | material | phase | thickness | material | thickness | C-axis orientation | response | visual inspection | haze | visual inspection | haze | |
| | - | - | [nm] | - | | [nm] | - | [μm] | [°] | [-] | - | [%] | - | [%] | |
| Ex. 11 | ZnO | - | 100 | SAZO | α | 10 | PET | 125 | 12 | ◎ | ○ | 2 | ○ | 3 | ◎ |
| Ex. 12 | ZnO | - | 200 | SAZO | α | 10 | PET | 125 | 9 | ◎ | ○ | 5 | ○ | 5 | ◎ |
| Ex. 13 | ZnO | - | 200 | SAZO | α | 10 | PET | 50 | 14 | ◎ | ○ | 5 | ○ | - | ◎ |
| Ex. 14 | ZnO | - | 200 | SAZO | α | 10 | PET | 38 | 11 | ◎ | ○ | - | ○ | - | ◎ |
| Ex. 15 | ZnO | - | 200 | SAZO | α | 10 | PET | 25 | 13 | ◎ | ○ | - | ○ | - | ◎ |
| Ex. 16 | ZnO | - | 200 | TSR | α | 50 | PET | 50 | 14 | ◎ | ○ | - | ○ | - | ◎ |
| Ex. 17 | ZnO | Mg | 200 | SAZO | α | 50 | PET | 50 | 11 | ◎ | ○ | 1 | ○ | - | ◎ |
| Ex. 18 | ZnO | V | 200 | SAZO | α | 50 | PET | 50 | 10 | ◎ | ○ | - | ○ | - | ◎ |
| Ex. 19 | ZnO | Mg,Si | 200 | SAZO | α | 50 | PET | 50 | 10 | ◎ | ○ | 0.7 | ○ | - | ◎ |

FIG.4C

| | piezoelectric layer | | | orientation control layer | | | base film | | piezoelectric properties | | degree of cracking (initial state) | | degree of cracking (after bending) | | overall evaluation |
|---|---|---|---|---|---|---|---|---|---|---|---|---|---|---|---|
| | material | sub-component | thick-ness | material | phase | thick-ness | mate-rial | thick-ness | C-axis orien-tation | response | visual inspec-tion | haze | visual inspec-tion | haze | |
| | - | - | [nm] | - | - | [nm] | - | [μm] | [°] | [-] | - | [%] | - | [%] | - |
| Com. 1 | ZnO | - | 50 | n/a | - | - | COP | 100 | 27 | × | ○ | - | ○ | - | × |
| Com. 2 | ZnO | - | 50 | ITO | c | 30 | COP | 100 | 26 | × | ○ | - | ○ | - | × |
| Com. 3 | ZnO | - | 400 | SAZO | α | 10 | COP | 100 | 7 | ◎ | × | - | × | - | × |
| Com. 4 | ZnO | - | 50 | n/a | - | - | PET | 125 | 26 | × | ○ | 1 | ○ | 1 | × |
| Com. 5 | ZnO | - | 100 | n/a | - | - | PET | 125 | 25 | × | ○ | 2 | ○ | 4 | × |
| Com. 6 | ZnO | - | 200 | n/a | - | - | PET | 125 | 25 | × | ○ | 2 | ○ | 2 | × |
| Com. 7 | ZnO | - | 400 | n/a | - | - | PET | 125 | 16 | ○ | × | 7 | × | 7 | × |
| Com. 8 | ZnO | - | 800 | n/a | - | - | PET | 125 | 15 | ○ | × | 8 | × | - | × |
| Com. 9 | ZnO | - | 400 | SAZO | α | 10 | PET | 125 | 14 | ○ | × | 7 | × | 7 | × |
| Com. 10 | ZnO | - | 800 | SAZO | α | 10 | PET | 125 | 9 | ◎ | × | 11 | × | - | × | ePIEZOELECTRIC DEVICE WITH ORIENTATION CONTROL LAYER FORMED OF SAZO AND MANUFACTURING METHOD THEREOF

This application claims the priority of Japanese Patent Application No. 2017-065547, filed on Mar. 29, 2017, in the JPO (Japanese Patent Office). Further, this application is the National Phase Application of International Application No. PCT/JP2018/009015, filed on Mar. 8, 2018, which designates the United States and was published in Japan. Both of the priority documents are hereby incorporated by reference in their entireties.

TECHNICAL FIELD

The present invention relates to a piezoelectric device and a manufacturing method thereof.

BACKGROUND ART

Piezoelectric devices making use of the piezoelectric effect of substances have conventionally been used. The piezoelectric effect refers to a phenomenon in which microscopic polarization is produced in response to a mechanical stress applied to the substance. Using the piezoelectric effect, various sensors including pressure sensors, acceleration sensors, and acoustic emission (AE) sensors for detecting elastic waves are manufactured.

As a piezoelectric material, a thin film with a wurtzite crystal structure, such as zinc oxide (ZnO) or aluminum nitride (AlN), is used. The wurtzite crystal structure has a hexagonal unit cell and the electric polarization vector is parallel to the c-axis. In order to exhibit piezoelectric properties using a piezoelectric layer of a wurtzite crystal material, it is necessary to improve the crystallinity of the piezoelectric layer, and a certain degree of thickness is required. From the viewpoint of imparting flexibility to the piezoelectric device, a layered structure of a piezoelectric sensor in which a polyimide layer inserted has been proposed (for example, see Patent Document 1 listed below).

PRIOR ART DOCUMENTS

Patent Documents

Patent Document 1: Japanese Patent Application Laid-open Publication No. 2011-185681

SUMMARY OF THE INVENTION

Technical Problem to be Solved

A piezoelectric layer formed of a wurtzite crystal material exhibits piezoelectric properties by the crystal orientation being aligned vertically to the substrate. When the thickness of the piezoelectric layer is increased for the purpose of improving the crystallinity, a problem such as cracking or crazing may arise. Especially when a flexible plastic film is used as a base film, this issue tends to be conspicuous. By reducing the thickness of the wurtzite crystal film, cracking or crazing may be suppressed; but the crystal orientation becomes insufficient and the piezoelectric properties are degraded compared with a piezoelectric layer with a sufficient thickness. In fact, in the above-described prior art document, a piezoelectric film with a thickness of several microns or more is used as a preferred range of the thickness for a good piezoelectricity.

Meanwhile, along with downsizing of electronic devices such as smartphones and wearable devices, the size required for piezoelectric devices is becoming smaller and smaller. A thin piezoelectric device with satisfactory piezoelectric properties is desired. Besides, because there are a wide variety of operating environments and conditions for devices to which a piezoelectric sensor is applied, it is desirable for the piezoelectric device to have sufficient flexibility.

In view of these technical problems, it is one of objectives of the present invention to provide a piezoelectric device using a flexible plastic layer and exhibiting a satisfactory piezoelectric property while suppressing cracking or crazing, and a method for manufacturing the same.

Technical Solutions

In the embodiments, an orientation control layer of amorphous phase is disposed under a piezoelectric layer formed of a wurtzite crystal material.

More particularly, in one aspect of the invention, a piezoelectric device has a layered structure in which at least a first electrode, a plastic layer, an orientation control layer, a piezoelectric layer, and a second electrode are stacked,
wherein the orientation control layer is amorphous, and the piezoelectric layer with a thickness of 20 nm to 250 nm is provided over the orientation control layer, the piezoelectric layer having a wurtzite crystal structure, and
wherein the orientation control layer and the piezoelectric layer are provided between the first electrode and the second electrode.

In another aspect of the invention, a manufacturing method of a piezoelectric device having a layered structure in which at least a first electrode, a plastic layer, an orientation control layer, a piezoelectric layer, and a second electrode are stacked, the method comprising:
forming an orientation control layer in amorphous phase on the plastic layer or on a stacking of layers including the plastic layer, and
forming the piezoelectric layer having a wurtzite crystal structure at a thickness of 20 nm to 250 nm over the orientation control layer of the amorphous phase.

Advantageous Effect of the Invention

With the above-described configuration and process, a piezoelectric device having a flexible plastic layer and exhibiting a satisfactory piezoelectric property, while suppressing cracking or crazing, can be achieved.

BRIEF DESCRIPTION OF DRAWINGS

FIG. 1 is a schematic diagram of a piezoelectric sensor according to an embodiment;

FIG. 2(A) and FIG. 2(B) show cross-sectional transmission electron microscopy(TEM) images of stacking a piezoelectric layer over an orientation control layer of amorphous phase fabricated according to the embodiment;

FIG. 3(A) and FIG. 3(B) show orientations of the stacking of the piezoelectric layer over the orientation control layer of amorphous phase fabricated according to the embodiment;

FIG. 4A illustrates experimental results of evaluating properties of piezoelectric sensors according to the embodiment;

FIG. 4B illustrates experimental results of evaluating properties of piezoelectric sensors according to the embodiment;

FIG. 4C illustrates experimental results of evaluating properties of piezoelectric sensors according to comparative examples;

DESCRIPTION OF PREFERRED EMBODIMENTS

Figure 5:
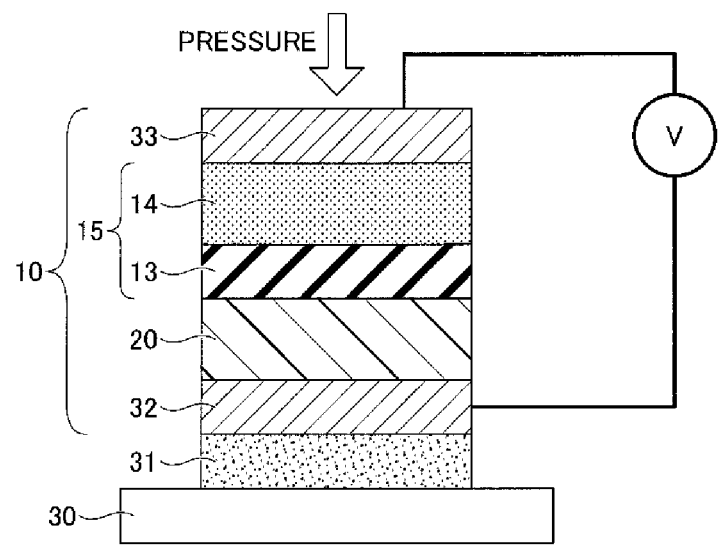
FIG. 5 is a schematic diagram illustrating a response evaluation test for piezoelectric devices fabricated.

In general, to enhance the orientation of a wurtzite material, it is considered to be better to dispose a crystal film under the wurtzite material because the wurtzite crystal can grow in alignment with the crystal structure of the underlayer. It is also assumed that a piezoelectric layer using a crystal-orientated wurtzite material is formed sufficiently thick to improve the crystallinity. However, increasing the thickness of the piezoelectric layer tends to cause cracking or crazing, as has been described above. This tendency appears more conspicuously particularly when a flexible plastic layer is used as a substrate. In contrast, according to the present invention, an orientation control layer of amorphous phase is disposed under a piezoelectric layer with a wurtzite crystal structure, thereby reducing the thickness of the piezoelectric layer, suppressing cracking or crazing, and achieving a satisfactory piezoelectric property.

FIG. 1 is a schematic diagram of a piezoelectric sensor 10A which is an example of the piezoelectric device. The piezoelectric sensor 10A is formed in a layered structure including a pair of electrodes 11 and 19 and a plastic layer 12, in which a stacking 15 of an orientation control layer 13 and a piezoelectric layer 14 is provided between the electrodes 11 and 19. In the example of FIG. 1, the electrode 11 serves as a transparent bottom electrode, and the electrode 19 serves as a transparent top electrode. The transparency of the electrode 11 and the electrode 19 is not always required; however, when applied to a display, including a touch panel, it is desirable for the piezoelectric sensor 10A to have a transparent electrode made of ITO, IZO or the like.

The piezoelectric layer 14 is made of a piezoelectric material with a wurtzite crystal structure, and has a thickness of 20 nm to 250 nm. With this range of thickness of the piezoelectric layer 14, cracking and/or crazing can be suppressed. If the thickness of the piezoelectric layer 14 exceeds 250 nm, cracking or crazing is more likely to occur, which affects the degree of haze. When the thickness of the piezoelectric layer 14 is less than 20 nm, it is difficult to achieve a satisfactory piezoelectric property (or a polarization property in accordance to pressure) even when the orientation control layer 13 is used as the underlayer. Here, the thickness of the piezoelectric layer 14 is preferably 30 nm to 200 nm, and more preferably 50 nm to 100 nm.

The wurtzite crystal structure is represented by general formula AB, where A denotes cation ($A^{n+}$) and B denotes anion ($B^{n-}$). It is desirable for the wurtzite piezoelectric material to exhibit the piezoelectric effect to a certain extent or more and be crystallized at a low-temperature process of 200° C. or below. Examples of such a material include zinc oxide (ZnO), zinc sulfide (ZnS), zinc selenide (ZnSe), zinc telluride (ZnTe), aluminum nitride (AlN), gallium nitride (GaN), cadmium selenide (CdSe), telluride Cadmium (CdTe), silicon carbide (SiC), etc. Any one of these components or a combination of two or more elements used in the above-described components may be used. When using a combination of two or more elements, thin films of the respective elements may be layered. Alternatively, one of or a combination of two or more of these components may be used as the basic component, and other elements may be added optionally as a sub component. The content of the sub component (i.e., element(s) other than the basic component) will not be limited as long as the advantageous effect of the present invention is achieved. The content of element(s) to be added other than the basic component may range from 0.1 at. % to 20 at. %, preferably equal to or greater than 0.1 at. % and equal to or less than 10 at. %, and more preferably equal to or greater than 0.2 at. % and equal to or less than 5 at. %. For example, a wurtzite material whose basic component is ZnO or AlN may be used, and a metal that does not exhibit electrical conductivity when added may be doped in ZnO or AlN. Such a dopant may include, but is not limited to, silicon (Si), magnesium (Mg), vanadium (V), titanium (Ti), zirconium (Zr), etc. One of, or two or more of the dopants may be added. By adding these metals, the frequency of occurrence of cracking or crazing can be reduced, which will be described in more detail below. When a transparent wurtzite crystal material is used as the piezoelectric layer 14, it is suitable for application to a display.

The orientation control layer 13 provided under the piezoelectric layer 14 is an amorphous layer with a thickness of 3 nm to 100 nm. Using the orientation control layer 13 with the film thickness of this range, the crystal orientation (c-axis orientation) of the piezoelectric layer 14 can be improved. By selecting the film thickness of the orientation control layer 13 of amorphous phase ranging from 3 nm to 100 nm, the full width at half maximum (FWHM) of the X-ray rocking curve with respect to the piezoelectric layer 14 is maintained low, as will be described later.

The orientation control layer 13 may be formed of an inorganic material, an organic material, or a mixture of an inorganic material and an organic material. As the inorganic material, silicon oxide ($SiO_x$), silicon nitride (SiN), aluminum nitride (AlN), aluminum oxide ($Al_2O_3$), gallium nitride (GaN), gallium oxide ($Ga_2O_3$), or the like may be used. ZnO to which $Al_2O_3$ and $SiO_x$ are added (hereinafter referred to as "SAZO") may also be used. Alternatively, GaN, AlN, or ZnO to which at least one of $Al_2O_3$, $Ga_2O_3$, $SiO_x$, and SiN is added may be used. Examples of the organic material include, but are not limited to, acrylic resins, urethane resins, melamine resins, alkyd resins, and siloxane polymers. In particular, it is preferable to use a thermosetting resin made of a mixture of a melamine resin, an alkyd resin, and an organic silane condensate as the organic substance. Using the above materials, an amorphous film can be formed by vacuum evaporation, sputtering, ion plating, coating, or the like. The orientation control layer may be a single layer or a multilayer including two or more films. When using a multilayer, an inorganic thin film and an organic thin film may be stacked.

The orientation control layer 13 formed in amorphous phase using these materials is superior in surface smoothness and it controls the orientation of the c-axis of the wurtzite material of the upper layer to align in the vertical (or the layered) direction. Besides, the gas barrier property is high, and the adverse influence of a gas generated from the plastic layer during the process of deposition of the films can be reduced. In particular, a thermosetting resin is amorphous and its surface is highly smooth. A melamine resin is dense owing to the three-dimensional crosslinked structure, and has a high barrier property. Although the orientation control layer according to the present invention is formed in amorphous phase, the entirety of the orientation control layer is not necessarily amorphous, and a non-amorphous portion may be included as long as the effect of the present invention is achieved. In the orientation control layer, the proportion of the amorphous part is 90% or more, preferably 95% or more, and more preferably 100%.

The plastic layer 12 is formed of a flexible material capable of imparting flexibility to the piezoelectric sensor 10A. The thickness of the plastic layer 12 is preferably 5 μm to 150 μm, and more preferably 20 μm to 125 μm. Materials of the plastic layer 12 includes, but are not limited to, polyethylene terephthalate (PET), polyethylene naphthalate (PEN), polycarbonate (PC), acrylic resin, cycloolefin polymer, polyimide (PI), or the like. Among these materials, polyethylene terephthalate (PET), polyethylene naphthalate (PEN), polycarbonate (PC), acrylic resin, and cycloolefin polymer are colorless, transparent materials, and they are suitable when electrodes 11 and 19 are transparent electrodes. When optical transparency is not required for the piezoelectric sensor 10A as in a health care product such as a pulse meter or a heart rate monitor, or in an in-vehicle pressure detection sheet, a semi-transparent or non-transparent plastic material may be used.

Although in the configuration of FIG. 1, the plastic layer 12 is provided between the electrode 11 and the stacking 15, the position of the plastic layer 12 is not limited to this example, and a suitable position may be selected as long as the plastic layer 12 imparts the flexibility to the piezoelectric sensor 10A.

The piezoelectric sensor 10A can be fabricated by the following process. The electrode 11 is formed over the back face of the plastic layer 12 that serves as a plastic base. The electrode 11 is, for example, an ITO film formed by direct current (DC) or radio frequency (RF) magnetron sputtering. Depending on the application of the device, the ITO film may be formed as a full-coverage solid electrode, or it may be processed into a predetermined pattern by etching or the like. When the piezoelectric sensor 10A is used as a pressure sensor for a touch panel or the like, the electrode 11 may be patterned into multiple stripes arranged in parallel along a first direction.

An orientation control layer 13 is formed in amorphous phase over the top face of the plastic layer 12, opposite to the electrode 11, at a thickness of 3 nm to 100 nm by, for example, sputtering at room temperature. When the thickness is less than 3 nm, it becomes difficult to sufficiently improve the orientation of the upper piezoelectric layer 14. With the thickness exceeding 100 nm, it also becomes difficult to improve the crystallinity of the upper piezoelectric layer 14. The temperature for the film formation of the orientation control layer 13 is not necessarily room temperature as long as the amorphous phase can be maintained, and the orientation control layer 13 may be formed at, for example, a substrate temperature of 150° C. or below.

Subsequently, the piezoelectric layer 14 is formed over the orientation control layer 13. For example, a ZnO target is used to form a film by RF magnetron sputtering in a mixed gas atmosphere of argon (Ar) and a small amount of oxygen (O$_2$). The film thickness of the ZnO piezoelectric layer 14 is 20 nm to 250 nm. The stacking 15 is formed by the orientation control layer 13 and the piezoelectric layer 14. The film forming temperature of ZnO is not necessarily a room temperature as long as the amorphous phase of the under layer, that is, the orientation control layer 13 is maintained during the process. The piezoelectric layer 14 may be formed at, for example, a substrate temperature of 150° C. or below.

When adopting sputtering to form the orientation control layer 13 and the piezoelectric layer 14, a uniform file with strong adhesion can be formed while substantially maintaining the composition ratio of the compound of the target. In addition, a film can be formed at a desired thickness highly accurately only by controlling the time.

Then, an electrode 19 is formed in a predetermined pattern over the piezoelectric layer 14. For the electrode 19, an ITO film with a thickness of 20 nm to 100 nm may be formed by DC or RF magnetron sputtering at room temperature. The electrode 19 may be a full-coverage solid layer formed over the entire surface of the layered structure. Alternatively, when the bottom electrode 11 is patterned into parallel stripes, the electrode 19 may also be patterned into stripes extending in a direction orthogonal to the stripes of the bottom electrode. Thus, the piezoelectric sensor 10A is fabricated.

After the electrode 19 is formed, the entirety of the piezoelectric sensor 10A may be heat-treated at a temperature (for example, 130° C.) lower than the melting point or the glass transition point of the plastic layer 12. By this post-heating, the ITO electrode can be crystallized to reduce the electrical resistance. This heat treatment is not indispensable, and it may not be performed because the piezoelectric layer 14 has a satisfactory degree of crystal orientation owing to the amorphous-phase orientation control layer 13 positioned below so as to sufficiently exhibit the piezoelectric response even without the post-heating. Depending on the material of the plastic layer 12, the plastic layer 12 may not be thermostable or heat-resistant, and it may be desirable not to perform post-heating depending on the situation. The stacking 15 of the orientation control layer 13 of amorphous phase and the piezoelectric layer 14 formed thereon is particularly advantageous when a plastic layer 12 with low heat resistance is used to ensure flexibility.

FIG. 2(A) and FIG. 2(B) show cross-sectional TEM images of the stacking of the orientation control layer 13 and the piezoelectric layer 14 actually fabricated over a plastic (PET) base film 20. FIG. 2(A) is an enlarged view at magnifications of 500,000 times, and FIG. 2(B) is an enlarged view at magnifications of 2 million times. Amorphous SAZO is used as the orientation control layer 13 and zinc oxide (ZnO) is used as the piezoelectric layer 14. In general, "AZO" comprised of ZnO as the basic component with $Al_2O_3$ added as a sub component is a conductive film with high crystallinity. By further adding $SiO_2$, an amorphous and electrically insulating SAZO film can be obtained. The thickness of this orientation control layer 13 is 10 nm, and the thickness of the piezoelectric layer 14 is 50 nm. As can be observed from the TEM image of FIG. 2(A), the piezoelectric layer 14 is formed over the amorphous orientation control layer 13 having a smooth and uniform surface. In the TEM image of FIG. 2(B), a large number of lines running in the vertical direction of the piezoelectric layer 14 indicate the direction of crystal growth. It is clearly shown that the c-axis of the piezoelectric layer 14 is aligned vertical to the substrate.

FIG. 3(A) and FIG. 3(B) show X-ray measurement results of the sample of FIG. 2(A) and FIG. 2(B). FIG. 3(A) shows an X-ray diffraction (XRD) pattern obtained by θ-2θ measurement, and FIG. 3(B) shows an X-ray rocking curve across (0002) reflection from the ZnO. The vertical axis of FIG. 3(A) represents intensity (as an arbitrary unit), and the vertical axis of FIG. 3(B) represents intensity as the number of counts per second [cps]. In FIG. 3(A), a strong peak derived from the (002) facet of ZnO appears at a diffraction angle (2θ) of 34° (degrees). The small peaks observed in the vicinity of 54° and 72° in terms of 2θ are derived from the PET base material. The orientation control layer 13 is made of amorphous SAZO and crystal growth is hardly observed in the cross-sectional TEM image of FIG. 2(B), unlike the ZnO piezoelectric layer 14.

In the rocking curve measurement, a wafer (that is, a crystal surface) is rotated, while the X-ray source and the detector are fixed, to acquire a tilt distribution of crystal axes, and fluctuations in crystal orientation in the thin film are observed. The FWHM value of the rocking curve of FIG. 3(B) is indicative of the c-axis orientation of the piezoelectric layer 14. The smaller the FWHM value, the better the crystal orientation. In this sample, the FWHM (representing the c-axis orientation) is satisfactory as 14°. A preferred range of the FWHM value indicative of the c-axis orientation is 3° to 15°.

4A and 4B show evaluation results of samples of Examples 1 to 19, which are fabricated by varying parameters of the stacking 15 and with different materials of the base film. FIG. 4C shows evaluation results of samples with comparative structures 1 to 10 in the table. The parameters of the sample include material, thickness, and subcomponent(s) (additives) of the piezoelectric layer 14; material, phase (amorphous or crystalline), and thickness of the orientation control layer 13; and material and thickness of the base film. Items to be evaluated include c-axis orientation and piezoelectric response as for piezoelectric properties, and visual inspection and haze measurement (cloudy appearance) as for degree of cracking. The degree of cracking is observed both in the initial state and after bending test.

The c-axis orientation is judged from measurement of X-ray rocking curve on each sample and by determining the FWHM value. Piezoelectric response is judged from measurement of a voltage level generated under application of a pressure onto the sample. Satisfactory piezoelectric response is indicated by a double circle (⊚), acceptable piezoelectric response is indicated by a single circle (○), and poor piezoelectric response is indicated by a cross mark (x).

The degree of cracking is an index used to judge whether cracks exist or not and to what extent cracks occur. For the evaluation of the degree of cracking, two types of assessments, visual inspection and haze measurement, are performed. Visual inspection is assessment of the sample appearance. When no cloudiness or unclearness is observed at a first glance, it is assessed as acceptable and marked with a single circle. When any cloudiness or unclearness is observed at a first glance, it is assessed as unacceptable (marked with "x"). The haze is indicated by a haze value (%) of the sample measure by a haze meter manufactured by Suga Test Instruments Co., Ltd. The degree of cracking (after bending) is judged by visual inspection and haze measurement after the sample is placed around a cylinder with a diameter of 9 mm and held for 30 seconds under a load of 100 grams.

The criteria for the overall evaluation are as follows:
Good (marked with double circle "⊚"): Piezoelectric properties are good (with double circle), and degree of cracking is acceptable with acceptable visual inspection result (with single circle) and a haze value less than or equal to 5.0 for those samples to which haze measurement is performed:
Acceptable (marked with single circle "○"): piezoelectric properties are acceptable (with single circle), and degree of cracking is acceptable with acceptable visual inspection result (with single circle) and a haze value less than or equal to 5.0 for those samples to which haze measurement is performed:
Unacceptable (marked with "x"): Piezoelectric properties do not meet the required conditions, or the degree of cracking is unacceptable (marked with "x") with cloudiness or cracking observed by visual inspection and a haze value of more than 5.0 for those samples to which haze measurement is performed.

Example 1

As the plastic base film, cyclo-olefin polymer (COP) with a thickness of 100 μm is used. On the COP is a 10 nm thick SAZO amorphous film formed as the orientation control layer 13 by DC magnetron sputtering at room temperature. The orientation control layer 13 was formed in a mixed gas of argon (Ar) and oxygen ($O_2$), under a process pressure of 0.2 Pa, using a 4-inch flat target, and at an output power of 200 W. Over the SAZO amorphous film, a 50 nm thick ZnO film is formed as the piezoelectric layer 14 by RF magnetron sputtering at room temperature. The piezoelectric layer 14 was formed in an Ar/$O_2$ mixed gas under a process pressure of 0.2 Pa, using a 4-inch flat target, and at an output power of 300 W.

A sample of 3 mm diameter (or 3 mm×3 mm square) is fabricated by the above-described process. As a parameter for the piezoelectric property, the c-axis orientation of this sample was evaluated by X-ray rocking curve measurement. A good FWHM value of 11° was obtained. In addition, as a direct evaluation index of piezoelectric property, a piezoelectric response was evaluated under the application of a pressure. The piezoelectric response is measured by setting the fabricated sample in an experimental setup illustrated in FIG. 5 and reading a voltage.

In FIG. 5, a sample with the stacking 15 formed on the base film 20 is sandwiched between a pair of electrodes 32 and 33 to produce a piezoelectric device 10. The piezoelectric device 10 is fixed onto the stage 30 with an adhesive layer 31. The layered structure of this piezoelectric device 10 is the same as that of the piezoelectric sensor 10A illustrated in FIG. 1. An external pressure is applied to the piezoelectric device 10 and a voltage between the electrodes 32 and 33 is measured. The pressure is applied under a load of 400 grams (0.55 N/$mm^2$) at a frequency of 5 Hz at room temperature. The average of 10 measurements in 2 seconds is recorded as the voltage measurement value.

Figure 6:
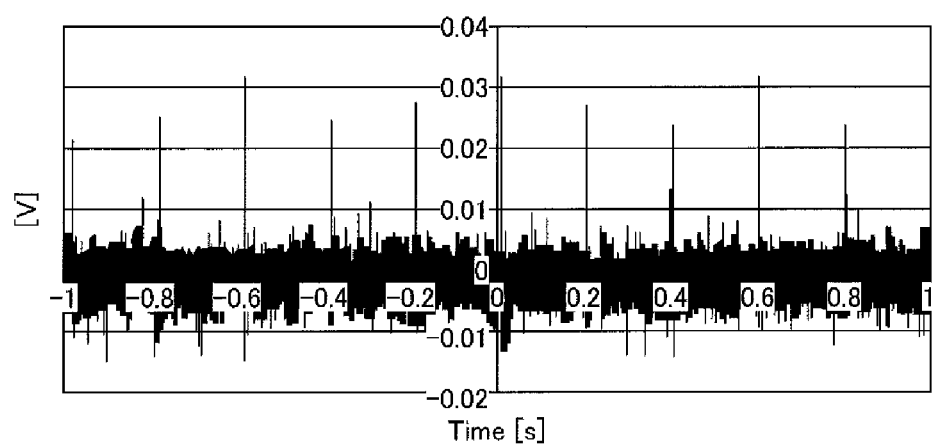
FIG. 6 illustrates an example of measurement acquired from the response evaluation test of FIG. 5.

FIG. 6 shows the measured piezoelectric response. Voltage peaks are observed at regular intervals with very little time lags from the pressure application point of time, and there is little variation in peak values. The piezoelectric response of this sample is judged to be good (marked with double circle).

Then, the degree of cracking is judged from the appearance of the sample. At a first glance of the sample, no cloudiness (or cracks) is observed, and the degree of cracking is evaluated as acceptable (marked with single circle). Then, for post-bending evaluation, the sample was wound around a cylinder with a diameter of 9 mm, and bending stress is applied with a load of 100 grams to observe occurrence of cracking or crazing. Even after the bending test, cracking is not observed and the sample is evaluated as acceptable (marked with single circle). The overall evaluation of the sample of Example 1 is good (marked with double circle).

Example 2

A 10 nm thick SAZO amorphous film is formed as the orientation control layer 13 over a 100 μm thick COP at room temperature. Over the SAZO amorphous film is a 30 nm thick ZnO film formed as the piezoelectric layer 14 at room temperature, and a sample of 3 mm diameter (or 3 mm×3 mm square) is fabricated. The film forming conditions of the respective layers are the same as those in Example 1, except for the deposition time of the piezoelectric layer 14. In the sample of Example 2, the thickness of the piezoelectric layer 14 is reduced as compared with Example 1. The FWHM value representing the c-axis orientation of this sample is 14° which is slightly greater than that of Example 1 because of the decrease in the film thickness of the piezoelectric layer, and piezoelectric response is not as high as Example 1; however, these parameters are in the satisfactory range. Because the piezoelectric layer 14 is made thinner, it is strong with respect to cracking or crazing and exhibits good flexibility. No cloudiness or cracks have been observed in the visual inspection for the evaluation of degree of cracking. The overall evaluation of this sample is good (marked with double circle).

Example 3

A 10 nm thick SAZO amorphous film is formed as the orientation control layer 13 over a 100 μm thick COP at room temperature. Over the SAZO amorphous film is a 100 nm thick ZnO film formed as the piezoelectric layer 14 at room temperature, and a sample of 3 mm diameter (or 3 mm×3 mm square) is fabricated. The film forming conditions of the respective layers are the same as those in Example 1, except for the deposition time of the piezoelectric layer 14. In the sample of Example 3, the thickness of the piezoelectric layer 14 is doubled as compared with Example 1. The FWHM value representing the c-axis orientation of this sample is as small as 9° because of the increased thickness of the piezoelectric layer 14, and high piezoelectric response is obtained. Meanwhile, the flexibility is not so high as Examples 1 and 2, but is still in the acceptable range. In the visual inspection for the evaluation of degree of cracking, no cloudiness or cracks are observed. The overall evaluation of this sample is good (marked with double circle).

Example 4

A 10 nm thick SAZO amorphous film is formed as the orientation control layer 13 over a 100 μm thick COP at room temperature. Over the SAZO amorphous film is a 200 nm thick ZnO film formed as the piezoelectric layer 14 at room temperature, and a sample of 3 mm diameter (or 3 mm×3 mm square) is fabricated. The film forming conditions of the respective layers are the same as those in Example 1, except for the deposition time of the piezoelectric layer 14. In the sample of Example 4, the thickness of the piezoelectric layer 14 is further increased compared with Example 3. The FWHM value representing the c-axis orientation of this sample is as small as 7° because of the increased thickness of the piezoelectric layer 14, and high piezoelectric response is obtained. On the other hand, the flexibility is not so high as Examples 1 and 2, but is still in the acceptable range. In the visual inspection for the evaluation of degree of cracking, no cloudiness or cracks are observed. The overall evaluation of this sample is good (marked with double circle).

Example 5

A 50 nm thick SAZO amorphous film is formed as the orientation control layer 13 over a 100 μm thick COP at room temperature. Over the SAZO amorphous film is a 50 nm thick ZnO film formed as the piezoelectric layer 14 at room temperature, and a sample of 3 mm diameter (or 3 mm×3 mm square) is fabricated. The film forming conditions of the respective layers are the same as those in Example 1, except for the deposition time of the orientation control layer 13. In the sample of Example 5, the thickness of the piezoelectric layer 14 is as thin as that of Example 1, and the piezoelectric layer 14 and the orientation control layer 13 have the same thickness. The FWHM value representing the c-axis orientation of this sample is 15° which is slightly greater that those of Examples 1 to 4, but both the c-axis orientation and the piezoelectric response are sufficiently acceptable. The flexibility is not so high as Examples 1 and 2 due to the slightly increased total thickness of the stacking 15 including the orientation control layer 13 and the piezoelectric layer 14, but it is sufficiently acceptable. In the visual inspection for the evaluation of degree of cracking, no cloudiness or cracks are observed. The overall evaluation of this sample is acceptable (marked with single circle).

Example 6

A SAZO amorphous film of 3 nm thickness is formed as the orientation control layer 13 over a 100 μm thick COP at room temperature. Over the SAZO amorphous film is a 50 nm thick ZnO film formed as the piezoelectric layer 14 at room temperature, and a sample of 3 mm diameter (or 3 mm×3 mm square) is fabricated. The film forming conditions of the respective layers are the same as those in Example 1, except for the deposition time of the orientation control layer 13. In the sample of Example 6, the thickness of the piezoelectric layer 14 is as thin as that of Example 1, and the orientation control layer 13 is as thin as 3 nm. The FWHM value representing the c-axis orientation of this sample is 15° which is slightly greater that those of Examples 1 to 4, but both the c-axis orientation and the piezoelectric response are sufficiently acceptable. The flexibility is satisfactory because the total thickness of the stacking 15 including the orientation control layer 13 and the piezoelectric layer 14 is small. In the visual inspection for the evaluation of degree of cracking, no cloudiness or cracks are observed. The overall evaluation of this sample is acceptable (marked with single circle).

Example 7

A 10 nm thick SAZO amorphous film is formed as the orientation control layer 13 over a 50 μm thick polyimide (PI) film at room temperature. Over the SAZO amorphous film is a 50 nm thick ZnO film formed as the piezoelectric layer 14 at room temperature, and a sample of 3 mm diameter (or 3 mm×3 mm square) is fabricated. The film forming conditions of the respective layers are the same as those in Example 1. In the sample of Example 7, the material and the thickness of the plastic base film are different from those in Example 1, but the material and the thickness of the orientation control layer 13 and the piezoelectric layer 14 are the same as those in Example 1. The FWHM value representing the c-axis orientation of this sample is 11° which is the same as that in Example 1, and both the c-axis orientation and the piezoelectric response are good. The flexibility is also as good as Example 1. In the visual inspection for the evaluation of degree of cracking, no cloudiness or cracks are observed. The overall evaluation of this sample is good (marked with double circle).

Example 8

An amorphous aluminum nitride (AlN) film of a thickness of 50 nm is formed as the orientation control layer 13 on a 100 μm thick COP film by RF magnetron sputtering at room temperature. The orientation control layer 13 is formed in an Ar/O$_2$ mixed gas under a process pressure of 0.2 Pa, using a 4-inch flat target, and at an output power of 200 W. Over the AlN amorphous film is a 50 nm thick ZnO film formed as the piezoelectric layer 14 at room temperature, and a sample of 3 mm diameter (or 3 mm×3 mm square) is fabricated. The film forming conditions of the piezoelectric layer 14 are the same as those in Example 1. In the sample of Example 8, the material and the thickness of the amorphous-phase orientation control layer 13 are different from those in Example 1. The FWHM value representing the c-axis orientation of this sample is 14° which is slightly greater than that in Example 1, but both the c-axis orientation and the piezoelectric response are in the satisfactory range. The flexibility is good with no cracking observed. In the visual inspection for the evaluation of degree of cracking, no cloudiness or cracks are observed. The overall evaluation of this sample is good (marked with double circle).

Example 9

An amorphous silicon dioxide (SiO$_2$) film of a thickness of 50 nm is formed as the orientation control layer 13 on a 100 μm thick COP film by RF magnetron sputtering at room temperature. The orientation control layer 13 is formed in an Ar/O$_2$ mixed gas under a process pressure of 0.2 Pa, using a 4-inch flat target, and at an output power of 200 W. Over the SiO$_2$ amorphous film is a 50 nm thick ZnO film formed as the piezoelectric layer 14 at room temperature, and a sample of 3 mm diameter (or 3 mm×3 mm square) is fabricated. The film forming conditions of the piezoelectric layer 14 are the same as those in Example 1. In the sample of Example 9, the material and the thickness of the amorphous-phase orientation control layer 13 are different from those in Example 1. The FWHM value representing the c-axis orientation of this sample is 15° which is slightly greater than that in Example 1, but both the c-axis orientation and the piezoelectric response are within the acceptable range. In the visual inspection for the evaluation of degree of cracking, no cloudiness or cracks are observed. The overall evaluation of this sample is acceptable (marked with single circle).

Example 10

An amorphous SAZO film of a thickness of 10 nm is formed on a 125 μm thick PET base film. Over the SAZO amorphous film is a 50 nm thick ZnO film formed as the piezoelectric layer 14 at room temperature, and a sample of 3 mm diameter (or 3 mm×3 mm square) is fabricated. The sample is wound around a cylinder with a diameter of 9 mm and held for 30 seconds with a load of 100 grams, and then haze measurement is performed. Further, the c-axis orientation and the piezoelectric response are evaluated after the haze test. In the visual evaluation, no cloudiness is observed and the transparency of the sample is maintained even after the haze evaluation. The haze value is as small as "2". The FWHM value representing the c-axis orientation of this sample is 14° which is satisfactory, and both the c-axis orientation and the piezoelectric response are good. The overall evaluation of this sample is good (marked with double circles).

Example 11

A sample in which the thickness of the ZnO film serving as the piezoelectric layer is changed to 100 nm, while the other conditions are the same as those in Example 10, is fabricated, and haze measurement is performed in addition to the visual inspection as in Example 10. The transparency of the sample is maintained even after the haze measurement. The c-axis orientation is as small as 12°, and the piezoelectric response is good (with double circle). The overall evaluation of this sample is good (marked with double circles).

Example 12

A sample in which the thickness of the ZnO film serving as the piezoelectric layer is changed to 200 nm, while the other conditions are the same as those in Example 11, is fabricated, and haze measurement was performed in addition to the visual inspection as in Example 10. The transparency of the sample is maintained even after the haze measurement, and the haze value is 5%, which is within the acceptable range. The FWHM representing the c-axis orientation is as small as 9°, and the piezoelectric response is good (with double circle). The overall evaluation of this sample is good (marked with double circles).

Example 13

The thickness of the ZnO film that serves as the piezoelectric layer is set to 200 nm as in Example 12, and the thickness of the PET film used as the plastic base film is changed to 50 μm. The other conditions are the same as those in Example 12. The FWHM representing the c-axis orientation is 14° which is within the satisfactory range, and the piezoelectric response is good (with double circle). In the visual inspection for evaluating the degree of cracking, no cloudiness is observed and the haze value is "5" which is within the acceptable range. The overall evaluation of this sample is good (marked with double circles).

Example 14

The thickness of the ZnO film that serves as the piezoelectric layer is set to 200 nm as in Example 12, and the thickness of the PET film used as the plastic base film is changed to 38 μm. The other conditions are the same as those in Example 12. The FWHM representing the c-axis orientation is as small as 11°, and the piezoelectric response is also good (with double circle). In the visual inspection for evaluating the degree of cracking, no cloudiness is observed. The overall evaluation of this sample is good (marked with double circles).

Example 15

The thickness of the ZnO film that serves as the piezoelectric layer is set to 200 nm as in Example 12, and the thickness of the PET film used as the plastic base film is changed to 25 µm. The other conditions are the same as those in Example 11. The FWHM representing the c-axis orientation is as small as 13°, and both the c-axis orientation and the piezoelectric response are good (with double circle). In the visual inspection for evaluating the degree of cracking, no cloudiness is observed. The overall evaluation of this sample is good (marked with double circles).

Example 16

An orientation control layer 13 is formed with an amorphous thermosetting resin at a thickness of 50 nm on a PET film of 50 µm thickness. For the material of the orientation control layer 13, a thermosetting resin composition that contains a melamine resin, an alkyd resin, and an organic silane condensate at a weight ratio of 2 to 2 to 1 (2:1*1) as a solid content is diluted with methyl ethyl ketone such that the solid content concentration becomes 8 wt %. This solution is applied onto a main surface of the PET film and cured by heating at 150° C. for 2 minutes to form the orientation control layer 13 with a film thickness of 50 nm and a refractive index of 1.54. Over the amorphous-phase orientation control layer 13 is a 200 nm thick ZnO film formed as the piezoelectric layer 14 at room temperature, and a sample of 3 mm diameter (or 3 mm×3 mm square) is fabricated. The film forming conditions of the piezoelectric layer 14 are the same as those in Example 1, except for the deposition time. In the sample of Example 16, the material and the thickness of the orientation control layer 13 are different from Example 1. The FWHM value representing the c-axis orientation of this sample is 14° which is slightly greater than that of Example 1; however both the c-axis orientation and the piezoelectric response are in the satisfactory range. Flexibility is also good without visible cloudiness or cracks observed by the visual inspection for the evaluation of the degree of cracking. The overall evaluation of the sample is good (marked with double circle).

Example 17

An amorphous-phase orientation control layer 13 of a thickness of 50 nm is formed using an inorganic material SAZO on a PET film of 50 µm thickness. Over the amorphous-phase orientation control layer 13 is a piezoelectric layer 14 formed at a thickness of 200 nm. This piezoelectric layer 14 is a ZnO film that contains a 10 wt % magnesium (Mg) added as a dopant. With this composition, a sample of 3 mm diameter (or 3 mm×3 mm square) is fabricated. The FWHM value representing the c-axis orientation of the sample of Example 17 is as small as 11°, and the piezoelectric response is also good. As to the flexibility, no cloudiness or cracks are observed in the visual inspection before and after the haze measurement, and evaluation is within the acceptable range. The haze value is as small as 1%. The overall evaluation of this sample is good (marked with double circle). It is understood that by adding Mg in the piezoelectric layer 14, the crack suppressing effect is improved.

Example 18

An amorphous-phase orientation control layer 13 of a thickness of 50 nm is formed using an inorganic material SAZO on a PET film of 50 µm thickness. Over the amorphous-phase orientation control layer 13 is a piezoelectric layer 14 formed at a thickness of 200 nm. This piezoelectric layer 14 is a ZnO film that contains a 2 wt % vanadium (V) added as an dopant. With this composition, a sample of 3 mm diameter (or 3 mm×3 mm square) is fabricated. The FWHM value representing the c-axis orientation of the sample of Example 18 is as small as 10°, and the piezoelectric response is also good. As to the flexibility, no cloudiness or cracks are observed in the visual inspection before and after the haze measurement, and evaluation is within the acceptable range. The overall evaluation of this sample is good (marked with double circle). It is understood that by adding V in the piezoelectric layer 14, the crack suppressing effect is acquired as in Example 17.

Example 19

An amorphous-phase orientation control layer 13 of a thickness of 50 nm is formed using an inorganic material SAZO on a PET film of 50 µm thickness. Over the amorphous-phase orientation control layer 13 is a piezoelectric layer 14 formed at a thickness of 200 nm. This piezoelectric layer 14 is a ZnO film that contains a 10 wt % magnesium (Mg) and 2 wt % silicon (Si) both added as dopants. With this composition, a sample of 3 mm diameter (or 3 mm×3 mm square) is fabricated. The FWHM value representing the c-axis orientation of the sample of Example 19 is as small as 10°, and the piezoelectric response is also good. As to the flexibility, no cloudiness or cracks are observed in the visual inspection before and after the haze measurement, and evaluation is within the acceptable range. The haze value is 0.7 which is smaller than that in Example 17. The overall evaluation of this sample is good (marked with double circle). It is understood that by adding Mg and Si in the piezoelectric layer 14, the crack suppressing effect is improved.

Comparative Case 1

For Comparative Case 1, a sample that does not use an orientation control layer as the underlayer is fabricated. A ZnO film with a thickness of 50 nm is formed as the piezoelectric layer 14 at room temperature directly on a COP film with a thickness of 100 µm, and a sample of 3 mm diameter (or 3 mm×3 mm square) is fabricated. The film forming conditions of the piezoelectric layer 14 are the same as those in Example 1. Since the sample of Comparative Case 1 does not have an orientation control layer under the piezoelectric layer, the FWHM value representing the c-axis orientation is as great as 27°, and the piezoelectric response is out of the acceptable range. In the visual inspection for evaluating the degree of cracking, no cloudiness or the like is observed. The overall evaluation of this sample is "unacceptable" (marked with "x").

Comparative Case 2

For Comparative Case 2, a crystal-phase orientation control layer is inserted as the underlayer of the piezoelectric layer 14. A crystal-phase ITO film with a thickness of 30 nm is formed as the orientation control layer 13 on the COP film of a 100 µm thickness by DC magnetron sputtering. The film forming conditions for the orientation control layer 13 are using the Ar/oxygen mixed gas and a 4-inch flat target, at a process pressure of 0.2 Pa and the output power of 200 W. In order for crystallization of ITO, the substrate temperature is set to approximately 150° C. during the sputtering process. Then, a ZnO film with a thickness of 50 nm is formed as a piezoelectric layer 14 on the ITO film at room temperature, and a sample with a diameter of 3 mm (or 3 mm×3 mm square). The film forming conditions for the piezoelectric layer 14 are the same as those in Example 1. The ITO film of Comparative Case 2 serves both as an orientation control layer and a bottom electrode. The FWHM value representing the c-axis orientation of this sample is as great as 26°, and the piezoelectric response is out of the acceptable range. Although no cloudiness or the like is observed in the visual inspection for evaluating the degree of cracking, the overall evaluation is "unacceptable" (marked with "x") due to insufficient piezoelectric properties.

Comparative Case 3

In Comparative Case 3, the conditions are the same as in Example 1 except for the thickness of the piezoelectric layer 14. An amorphous-phase SAZO film of a 10 nm thickness is formed as an orientation control layer 13 on a COP film with a thickness of 100 μm at room temperature. On the amorphous-phase SAZO film is a ZnO film with a thickness of 400 nm formed as a piezoelectric layer 14 at room temperature, and a sample of a diameter of 3 mm (or 3 mm×3 mm square) is fabricated. The film forming conditions of the piezoelectric layer 14 are the same as those in Example 1 except for the deposition time. The sample of Comparative Case 3 has good crystallinity because the thickness of the piezoelectric layer 14 is increased. The FWHM value representing the c-axis orientation is as small as 7°, and high piezoelectric response is achieved. However, since the piezoelectric layer 14 is as thick as 400 nm, many cracks are observed by visual inspection for evaluating the degree of cracking, and cloudiness is observed in the sample. Due to the large number of cracks, the reliability of operation is impaired. The overall evaluation of this sample is "unacceptable" (marked with "x").

Comparative Cases 4 to 8

In Comparative Cases 4 to 8, PET with a thickness of 125 μm is used as the plastic base film, and the thickness of the ZnO film used as the piezoelectric layer is varied to 50 nm, 100 nm, 200 nm, 400 nm, and 800 nm, without providing the orientation control layer. In Comparative Cases 4 to 6, the haze value is maintained at a low value both in the initial state and after the bending test, and no clouding is observed by visual inspection (marked with single circle). However, the FWHM value representing the c-axis orientation is large, and the piezoelectric response is out of the acceptable range (marked with "x"). In Comparative Cases 7 and 8, the crystallinity is improved by increasing the thickness of the ZnO film, and the c-axis orientation and the piezoelectric response are within the acceptable range (marked with single circle). However, cracks are observed in visual inspection evaluating the degree of cracking, with a large haze value in the initial state. The evaluation of the degree of cracking is out of the acceptable range (marked with "x"). The overall evaluations of Comparative Cases 4 to 8 are "unacceptable" (marked with "x").

Comparative Cases 9 to 10

In Comparative Cases 9 and 10, a 10 nm thick amorphous SAZO is formed on the 125 μm thick PET base material, as in Example 11, and a ZnO film is formed on the amorphous SAZO, while changing the thickness to 400 nm and 800 nm. In Comparative Case 9 with the ZnO film of the 400 nm thickness, the FWHM value representing the c-axis orientation is relatively small and the piezoelectric response is in the acceptable range. However, since the thickness of the ZnO film is increased, cracks are observed by the visual inspection for evaluating the degree of cracking, and the haze value becomes high. The evaluation of the degree of cracking is out of the acceptable range (marked with "x"). In Comparative Case 10 with the ZnO film with a thickness of 800 nm, the FWHM value representing the c-axis orientation is small and good piezoelectric response is achieved. However, the haze value (in the initial state) is further increased, compared with Comparative Case 9. In the visual inspection, cracks are observed and the evaluation is out of the acceptable range (marked with "x"). The overall evaluations of Comparative Cases 9 and 10 are "unacceptable" (marked with "x").

From the results of Examples 1 to 15 and Comparative Cases 1 to 8, the advantageous effect of using the amorphous-phase orientation control layer 13 as the underlayer of the piezoelectric layer 14 is recognized; that is, satisfactory piezoelectric properties and flexibility (or crack suppression) are both achieved.

From the results of Examples 1 to 15, it is also understood that amorphous SAZO, AlN, or $SiO_x$ film is used favorably as the orientation control layer 13. In addition to these materials, amorphous silicon nitride (SiN), amorphous silicon carbide (SiC), amorphous aluminum oxide ($Al_2O_3$), amorphous gallium nitride (GaN), amorphous gallium oxide ($Ga_2O_3$), etc. can also be used for the orientation control layer 13.

From the results of Examples 10 to 12 and Comparative Cases 9 to 10, it is understood that the c-axis orientation and the piezoelectric response can be improved by increasing the thickness of the piezoelectric layer, but the haze value becomes high when the thickness of the piezoelectric layer 14 is 400 nm or more. In order to achieve both improved piezoelectric properties and crack suppression effect, it is desirable that the thickness of the piezoelectric layer 14 is in the range of 20 nm to 250 nm.

For the plastic base film, suitable types of polymers or synthetic resins can be used. The thickness of the plastic film capable of imparting flexibility to the piezoelectric layer 14, without hindering reduction in device thickness, is 5 μm to 150 μm, and more preferably, 25 μm to 125 μm.

Figure 7:
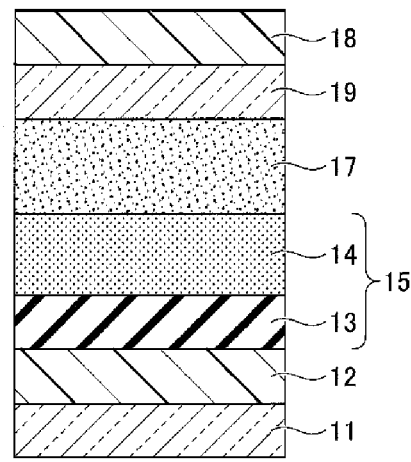
FIG. 7 is a schematic diagram of a modification of piezoelectric device.

FIG. 7 illustrates a configuration of a piezoelectric sensor 10B which is a modification of FIG. 1. In the piezoelectric sensor 10B, a plastic layer 18 is also disposed on the top electrode 19. As in FIG. 1, the stacking 15 of the orientation control layer 13 and the piezoelectric layer 14 is provided between the electrode 11 and the electrode 19. The electrode 11 is a transparent electrode that serves as a bottom electrode, and the electrode 19 is a transparent electrode that serves as an upper electrode. The orientation control layer 13 is an amorphous thin film with a thickness of 3 nm to 100 nm. The piezoelectric layer 14 is made of a wurtzite type piezoelectric material and has a thickness of 20 nm to 250 nm.

The piezoelectric sensor 10B can be fabricated as follows. The electrode 11 is formed on the back surface of the plastic layer 12 which serves as a plastic base film. On the other surface of the plastic layer 12 opposite to the electrode 11, an amorphous-phase orientation control layer 13 is formed at a thickness of 3 nm to 100 nm by, for example, sputtering at room temperature. Then, the piezoelectric layer 14 is formed successively on the orientation control layer 13, whereby the first part of the device is fabricated.

On the other hand, the electrode 19 is formed in a predetermined shape on the plastic layer 18 which is used as another base film to produce a second part of the device. The material of the first-part plastic layer 12 and the second-part plastic layer 18 may be the same or different from each other. For example, both the first-part plastic layer 12 and the second-part plastic layer 18 may be made of a polymer with a high dielectric constant. Alternatively, the first-part plastic layer 12 may be formed of a material with a higher dielectric constant than that of the second-part plastic layer 18. The piezoelectric layer 14 of the first part and the electrode 19 of the second part are held facing each other and bonded together by an adhesive layer 17.

The piezoelectric sensor 10B has the amorphous-phase orientation control layer 13 and the piezoelectric layer 14 with an appropriate thickness, like the piezoelectric sensor 10A, and has satisfactory piezoelectric properties. Besides, the plastic layers 12 and 18 are provided under and over the stacking 15, and the device is superior in flexibility.

Figure 8:
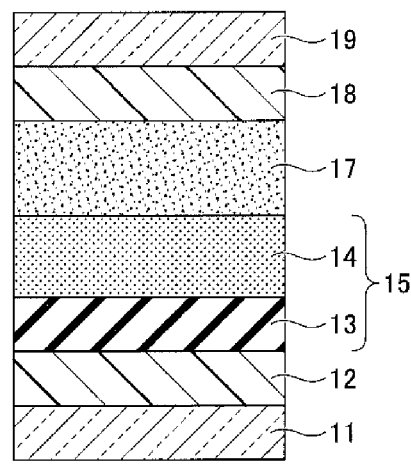
FIG. 8 is a schematic diagram of another modification of piezoelectric device.

FIG. 8 illustrates a configuration of a piezoelectric sensor 10C, which is another modification of FIG. 1. In the piezoelectric sensor 10C, plastic layers 12 and 18 are provided inside the pair of electrodes 11 and 19. The stacking 15 of the orientation control layer 13 and the piezoelectric layer 14 is provided between the electrode 11 and the electrode 19 as in FIG. 1. The electrode 11 is a transparent electrode that serves as a bottom electrode, and the plastic layer 12 is provided between the electrode 11 and the orientation control layer 13. The electrode 19 is a transparent electrode that serves as a top electrode, and the plastic layer 18 is provided between the electrode 19 and the piezoelectric layer 14. The orientation control layer 13 is an amorphous thin film with a thickness of 3 nm to 100 nm. The piezoelectric layer 14 is made of a wurtzite type piezoelectric material and has a thickness of 20 nm to 250 nm.

The piezoelectric sensor 10C is fabricated as follows. The electrode 11 is formed on the back surface of the plastic layer 12 that serves as a plastic base film. An amorphous-phase orientation control layer 13 and a crystal-phase piezoelectric layer 14 are formed successively on the other surface of the plastic layer 12 opposite to the electrode 11 to produce a first part.

On the other hand, the electrode 19 is formed in a predetermined shape on the plastic layer 18 which serves as another plastic base, and a second part is fabricated. The material of the first-part plastic layer 12 and the second-part plastic layer 18 may be the same or different from each other. For example, both the plastic layer 12 of the first part and the plastic layer 18 of the second part may be formed of a polymer with a high dielectric constant. The piezoelectric layer 14 of the first part and the plastic layer 18 of the second part are held facing each other, and bonded together by an adhesive layer 17.

The piezoelectric sensor 10C has the amorphous-phase orientation control layer 13 and the piezoelectric layer 14 with an appropriate thickness, like the piezoelectric sensor 10A, and has satisfactory piezoelectric properties. Besides, the plastic layers 12 and 18 are provided under and over the stacking 15, and the device is superior in flexibility.

Figure 9:
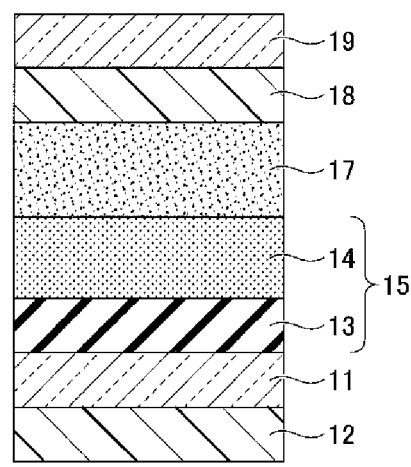
FIG. 9 is a schematic diagram of still another modification of piezoelectric device.

FIG. 9 illustrates a configuration of a piezoelectric sensor 10D which is still another modification of FIG. 1. In the piezoelectric sensor 10D, the plastic layer 12 is provided under the electrode 11, and the plastic layer 18 is provided under the other electrode 19. The stacking 15 of the orientation control layer 13 and the piezoelectric layer 14 is provided between the electrode 11 and the electrode 19 as in FIG. 1. The electrode 11 is a transparent electrode that serves as a bottom electrode, and the electrode 19 is a transparent electrode that serves as a top electrode. The orientation control layer 13 is an amorphous thin film and has a thickness of 3 nm to 100 nm. The piezoelectric layer 14 is made of a wurtzite type piezoelectric material and has a thickness of 20 nm to 250 nm.

The piezoelectric sensor 10D is fabricated as follows. The electrode 11 is formed in a predetermined shape on the plastic layer 12 serving as a base film. Over the plastic layer 12 with the electrode 11 having been formed, the orientation control layer 13 and the piezoelectric layer 14 are formed successively so as to cover the electrode 11 to produce a first part. On the other hand, the electrode 19 is formed in a predetermined shape on the plastic layer 18 which is another base film, to produce a second part. The material of the first-part plastic layer 12 and the second-part plastic layer 18 may be the same or different from each other. For example, both the first-part plastic layer 12 and the second-part plastic layer 18 may be formed of a polymer with a high dielectric constant. Alternatively, the first-part plastic layer 12 may be formed of a material having a higher dielectric constant than that of the second-part plastic layer 18. The piezoelectric layer 14 of the first part and the plastic layer 18 of the second part are held facing each other and bonded together by an adhesive layer 17.

The piezoelectric sensor 10D has the amorphous-phase orientation control layer 13 and the piezoelectric layer 14 with an appropriate thickness, like the piezoelectric sensor 10A, and has satisfactory piezoelectric properties. Besides, the plastic layers 12 and 18 are provided under and over the stacking 15, and the device is superior in flexibility.

Figure 10:
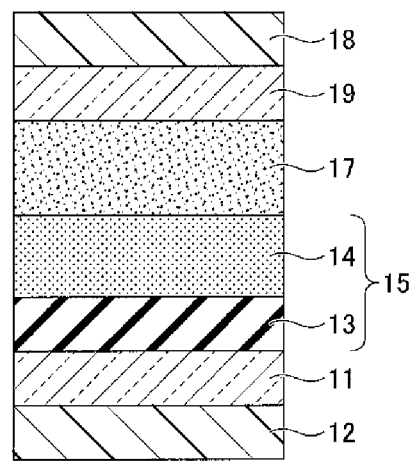
FIG. 10 is a schematic diagram of still another modification of piezoelectric device.

FIG. 10 illustrates a configuration of a piezoelectric sensor 10E which is still another modification of FIG. 1. In the piezoelectric sensor 10E, plastic layers 12 and 18 are provided on the outer faces of the pair of electrodes 11 and 19. The stacking 15 of the orientation control layer 13 and the piezoelectric layer 14 is provided between the electrode 11 and the electrode 19 as in FIG. 1. The electrode 11 is a transparent electrode that serves as a bottom electrode, and the plastic layer 12 is provided under the electrode 11. The electrode 19 is a transparent electrode that serves as a top electrode, and the plastic layer 18 is provided over the electrode 19. The orientation control layer 13 is an amorphous thin film with a thickness of 3 nm to 100 nm. The piezoelectric layer 14 is made of a wurtzite type piezoelectric material and has a thickness of 20 nm to 250 nm.

The piezoelectric sensor 10E is fabricated as follows. The electrode 11 is formed in a predetermined shape on the plastic layer 12 that serves as a base film. Over the plastic layer 12 with the electrode 11 having been formed in the predetermined pattern, the orientation control layer 13 and the piezoelectric layer 14 are formed successively so as to cover the electrode 11 to produce a first part. On the other hand, the electrode 19 is formed in a predetermined shape on the plastic layer 18 which serves as another base film to produce a second part. The material of the first-part plastic layer 12 and the second-part plastic layer 18 may be the same or different from each other. The piezoelectric layer 14 of the first part and the electrode 19 of the second part are held facing each other and bonded together by an adhesive layer 17.

The piezoelectric sensor 10E has the amorphous-phase orientation control layer 13 and the piezoelectric layer 14 of an appropriate thickness, like the piezoelectric sensor 10A, and has satisfactory piezoelectric properties. Besides, the plastic layers 12 and 18 are provided under and over the stacking 15, and the device is superior in flexibility.

In any of the configurations of FIG. 7 to FIG. 10, the upper piezoelectric layer has superior c-axis orientation by providing the amorphous-phase orientation control layer 13 underneath, and it exhibits satisfactory piezoelectric properties.

The configurations of the present invention including the stacking 15 of the amorphous-phase orientation control layer 13 and the crystal-phase piezoelectric layer 14 can be applied not only to the piezoelectric sensors, but also to other piezoelectric devices such as speakers or oscillators using the inverse piezoelectric effect. Upon application of alternating electrical signals to the piezoelectric layer 14, mechanical vibrations corresponding to the resonance frequencies are generated in the piezoelectric layer 14. Owing to the presence of the amorphous-phase orientation control layer 13 provided underneath, the c-axis orientation of the piezoelectric layer 14 is satisfactory, and accuracy in operation of the piezoelectric device can be improved. By using a plastic layer in the device, flexibility is improved and the device can be used in various environments.

The present application is based upon Patent Application No. 2017-065547 filed before the Japan Patent Office on Mar. 29, 2017, the entirety of which is incorporated herein.

LISTING OF SYMBOLS

10: piezoelectric device
10A-10E: piezoelectric sensor
11, 19: electrode
12, 18: plastic layer
13: orientation control layer
14: piezoelectric layer
15: stacking

What is claimed is:

1. A piezoelectric device comprising:
a layered structure in which at least a first electrode, a plastic layer, an orientation control layer, a piezoelectric layer, and a second electrode are stacked,
wherein the orientation control layer is amorphous, and the piezoelectric layer with a thickness of 20 nm to 250 nm is provided over the orientation control layer, the piezoelectric layer having a wurtzite crystal structure,
wherein the orientation control layer and the piezoelectric layer are provided between the first electrode and the second electrode in a stacking direction, and
wherein the orientation control layer is formed of amorphous zinc oxide as a basic component to which $Al_2O_3$ and $SiO_x$ are added.

2. The piezoelectric device as claimed in claim 1, wherein the orientation control layer has a thickness of 3 nm to 100 nm.

3. The piezoelectric device as claimed in claim 1, wherein the piezoelectric layer is formed of a material selected as a basic component from a group consisting of zinc oxide (ZnO), zinc sulfide (ZnS), zinc selenide (ZnSe), zinc telluride (ZnTe), aluminum nitride (AlN), gallium nitride (GaN), cadmium selenide (CdSe), cadmium telluride (CdTe), silicon carbide (SiC), and combinations thereof.

4. The piezoelectric device as claimed in claim 3, wherein the piezoelectric layer contains, as a subcomponent, a material selected from a group consisting of magnesium (Mg), vanadium (V), titanium (Ti), zirconium (Zr), silicon (Si), and combinations thereof, in the basic component.

5. The piezoelectric device as claimed in claim 1, wherein the piezoelectric layer contains as a dopant a material selected from a group consisting of magnesium (Mg), vanadium (V), titanium (Ti), zirconium (Zr), silicon (Si), and combinations thereof.

6. The piezoelectric device as claimed in claim 1, wherein the thickness of the piezoelectric layer is set in a range of 30 nm to 200 nm.

7. The piezoelectric device as claimed in claim 1, wherein a full width at half maximum of an X-ray rocking curve of the piezoelectric layer is 3° to 15°.

8. The piezoelectric device as claimed in claim 1, wherein the first electrode, the orientation control layer, the piezoelectric layer, and the second electrode are stacked in this order, and
wherein the plastic layer is provided between the first electrode and the orientation control layer, or under the first electrode.

9. The piezoelectric device as claimed in claim 1, wherein the plastic layer is formed of a material selected from a group consisting of polyethylene terephthalate (PET), polyethylene naphthalate (PEN), polycarbonate (PC), acrylic resin, cycloolefin polymer, and polyimide (PI).

10. The piezoelectric device as claimed in claim 1, wherein the plastic layer has a thickness of 5 µm to 150 µm.

11. The piezoelectric device as claimed in claim 1, wherein the first electrode and the second electrode are transparent electrodes, and the plastic layer is formed of a transparent material.

12. A manufacturing method of a piezoelectric device having a layered structure in which at least a first electrode, a plastic layer, an orientation control layer, a piezoelectric layer, and a second electrode are stacked, the manufacturing method comprising:
forming an orientation control layer in an amorphous phase on the plastic layer or on a stacking of layers including the plastic layer, and
forming the piezoelectric layer having a wurtzite crystal structure over the orientation control layer in the amorphous phase,
wherein the orientation control layer and the piezoelectric layer are provided between the first electrode and the second electrode in a stacking direction, and
wherein the orientation control layer is formed of amorphous zinc oxide as a basic component to which $Al_2O_3$ and $SiO_x$ are added.

13. The manufacturing method as claimed in claim 12, wherein a heat treatment is not included in a process of forming the piezoelectric layer or a subsequent process thereof.

14. The manufacturing method as claimed in claim 12, wherein the piezoelectric layer is formed by sputtering at room temperature.

15. The manufacturing method as claimed in claim 12, wherein the piezoelectric layer is formed at a thickness of 20 nm to 250 nm.

16. The manufacturing method as claimed in claim 12, wherein the orientation control layer is formed by sputtering at room temperature.

* * * * *